(12) United States Patent
Kelder et al.

(10) Patent No.: US 11,024,833 B2
(45) Date of Patent: *Jun. 1, 2021

(54) METHOD FOR COVERING PARTICLES, ESPECIALLY A BATTERY ELECTRODE MATERIAL PARTICLES, AND PARTICLES OBTAINED WITH SUCH METHOD AND A BATTERY COMPRISING SUCH PARTICLE

(71) Applicant: Forge Nano Inc., Thornton, CO (US)

(72) Inventors: Erik Maria Kelder, Nootdorp (NL); Jan Rudolf Van Ommen, Zwijndrecht (NL); John Nijenhuis, Asperen (NL)

(73) Assignee: Forge Nano Inc., Thornton, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/622,970

(22) Filed: Jun. 14, 2017

(65) Prior Publication Data
US 2017/0282140 A1    Oct. 5, 2017

Related U.S. Application Data

(62) Division of application No. 14/625,442, filed on Feb. 18, 2015, now Pat. No. 9,705,125, which is a division
(Continued)

(51) Int. Cl.
*H01M 4/04* (2006.01)
*B01J 2/16* (2006.01)
(Continued)

(52) U.S. Cl.
CPC ............. *H01M 4/0428* (2013.01); *B01J 2/16* (2013.01); *C23C 16/442* (2013.01);
(Continued)

(58) Field of Classification Search
CPC .. H01M 4/0428; H01M 4/131; H01M 4/1391; H01M 4/366; H01M 4/485;
(Continued)

(56) References Cited

U.S. PATENT DOCUMENTS 6,187,282 B1 * 2/2001 Hattori .................... C01B 13/34
423/223
6,333,128 B1 * 12/2001 Sunagawa ............. C01G 3/006
429/218.1
(Continued)

FOREIGN PATENT DOCUMENTS

EP           0824087 A1 *  2/1998 ............. C01B 13/34
JP       2002151077 A  *  5/2002
(Continued)

OTHER PUBLICATIONS

Myung et al., "Role of Alumina Coating on Li—Ni—Co—Mn—O Particles as Positive Electrode Material for Lithium-Ion Batteries"; Chem. Mater. 2005, 17, pp. 3695-3704 (published Jun. 15, 2005). (Year: 2005).*

(Continued)

*Primary Examiner* — Gregg Cantelmo
(74) *Attorney, Agent, or Firm* — Frank Rosenberg

(57) ABSTRACT

Described here is a powder comprising a plurality of lithium-containing particles having a dry, uniform protective layer, wherein the protective layer of the particles is obtained by a sequential vapor phase reaction or adsorption process. Also described is a battery comprising an anode layer and a cathode layer, wherein the cathode layer comprises lithium metal oxide or a lithium metal phosphate, wherein the metal comprises at least one of Nickel, Manganese, Cobalt, Iron, Titanium, and/or Manganese, wherein the cathode particles have a dry, uniform protective layer, and wherein the anode layer comprises lithium titanium oxide particles.

21 Claims, 7 Drawing Sheets

Related U.S. Application Data of application No. 11/955,184, filed on Dec. 12, 2007, now Pat. No. 8,993,051.

(51) Int. Cl.

| | | |
|---|---|---|
| C23C 16/44 | (2006.01) | |
| C23C 16/442 | (2006.01) | |
| C23C 16/455 | (2006.01) | |
| H01M 4/36 | (2006.01) | |
| H01M 4/505 | (2010.01) | |
| H01M 4/131 | (2010.01) | |
| H01M 4/485 | (2010.01) | |
| H01M 4/1391 | (2010.01) | |
| H01M 10/0525 | (2010.01) | |
| H01M 4/02 | (2006.01) | |

(52) U.S. Cl.
CPC .... *C23C 16/4417* (2013.01); *C23C 16/45525* (2013.01); *H01M 4/131* (2013.01); *H01M 4/1391* (2013.01); *H01M 4/366* (2013.01); *H01M 4/485* (2013.01); *H01M 4/505* (2013.01); *H01M 10/0525* (2013.01); *H01M 2004/028* (2013.01); *Y02E 60/10* (2013.01); *Y10T 428/2991* (2015.01)

(58) Field of Classification Search
CPC ............. H01M 4/505; H01M 10/0525; H01M 2004/028; C23C 16/4417; C23C 16/442; C23C 16/45525; B01J 2/16
See application file for complete search history.

(56) References Cited

U.S. PATENT DOCUMENTS

| | | | |
|---|---|---|---|
| 6,365,299 B1 | 4/2002 | Miyaki et al. | |
| 6,713,177 B2 | 3/2004 | George et al. | |
| 6,913,827 B2 | 7/2005 | George et al. | |
| 7,547,490 B2 * | 6/2009 | Spitler ................ | C01G 23/005 423/598 |
| 9,570,734 B2 * | 2/2017 | Kelder ................ | B01J 2/16 |
| 2001/0034123 A1 | 10/2001 | Jeon et al. | |
| 2002/0071991 A1 | 6/2002 | Kweon et al. | |
| 2002/0102205 A1 * | 8/2002 | Amatucci ........... | C01G 23/005 423/598 |
| 2002/0106461 A1 | 8/2002 | Talton | |
| 2002/0110518 A1 | 8/2002 | Okuda et al. | |
| 2002/0192551 A1 | 12/2002 | Yoshizawa et al. | |
| 2003/0026989 A1 * | 2/2003 | George ................ | B01J 2/006 428/402 |
| 2004/0087143 A1 | 5/2004 | Norman et al. | |
| 2004/0159830 A1 | 8/2004 | Weimer et al. | |
| 2005/0084610 A1 | 4/2005 | Selitser | |
| 2005/0112054 A1 * | 5/2005 | Eberman ............ | B82Y 30/00 423/594.4 |
| 2005/0252449 A1 | 11/2005 | Nguyen et al. | |
| 2006/0258134 A1 | 11/2006 | Derderian et al. | |
| 2007/0172657 A1 | 7/2007 | Fan et al. | |
| 2008/0241512 A1 * | 10/2008 | Boris .................. | B05D 5/083 428/328 |

FOREIGN PATENT DOCUMENTS

| | | | |
|---|---|---|---|
| JP | 2007059409 A | * | 3/2007 |
| KR | 20040096203 A | * | 11/2004 |

OTHER PUBLICATIONS

Beetstra et al. "Improved Li-Ion Battery Performance by Coating Cathode Nano-Particles using Atomic Layer Deposition"; (May 2007)—The 12th International Conference on Fluidization—New Horizons in Fluidization Engineering (Year: 2007).*

Snyder et al. "Synthesis and characterization of atomic layer deposited titanium nitride thin films on lithium titanate spinel powder as a lithium-ion battery anode"; Journal of Power Sources 165 (2007), pp. 379-385 (available online Dec. 16, 2006). (Year: 2006).*

Kim et al. "Enhanced electrochemical properties of LiNi1/3Co1/3Mn1/3O2 cathode material by coating with LiAlO2 particles", Journal of Power Sources 161 (2006) pp. 623-627 (available online Jun. 12, 2006). (Year: 2006).*

Wang et al. "Al2O3 Coated Li4Ti5O12 Electrode with Enhanced Cycle Performance for Lithium Ion Battery"; ECS Transactions, 59 (1), pp. 35-43 (2014). (Year: 2014).*

Cao et al. "LiAlO2-coated LiCoO2 as cathode material for lithium ion batteries"; Solid State Ionics 176 (2005), pp. 911-914. (Year: 2005).*

Puurunen "Surface chemistry of atomic layer deposition: A case study for the trimethylaluminum/water process"; J. Applied Physics 97, 121301 (2005), pp. 121301-1 through 12301-52 (available online Jun. 30, 2005). (Year: 2005).*

Kim et al. "Suppression of Cobalt Dissolution from LiCoO2 Cathodes with Various Metal-Oxide Coatings"; Journal of Electrochemical Society, 150 (12) pp. A1723-A1725 (Nov. 5, 2003). (Year: 2003).*

Cho et al.; "Novel LiCoO2 Cathode Material with Al2O3 Coating for a Li Ion Cell", Chem. Mater. 2000, 12, pp. 3788-3791. (Year: 2000).*

EPO Website (www.espacenet.com) machine translation of the detailed description of JP 2002151077A (Year: 2002).*

EPO Website (www.espacenet.com) machine translation of KR 2004-0096203A (Year: 2004).*

Beetstra, Improved Li-Ion Battery Performance, The 12th International Conference on Fluidization—New Horizons in Fluidization Engineering, vol. RP4, Article 44, Jul. 2007.

Engineering Conferences International (ECI),Program,"Fluidization XI, Present and Future for Fluidization Engineering." (May 9-14, 2004). http://www.engconf.org/pastconf/4affin.Pdf.

Ferguson et al. "TiO2 atomic layer deposition on ZrO2 particles using alternating exposures of TiCl4 and H2O", Applied Surface Science, 2004, vol. 226, pp. 393-404.

Kannan, Electrochemical and Solid-State Letters, 5(7)A167-A 169 (2002).

Lafont, U., "Nanopowders of Spinel-Type Electrode Materials for Li-ion Batteries", Solid State Ionics, 177, 2006, pp. 3023-3029.

McCormick et al,. "Rotary reactor for atomic layer deposition on large quantities of nanoparticles", Journal of Vacuum Science & Technology A, 2007, vol. 25, pp. 67-74.

Myung, Seung-Tack, et al., "Role of Alumina Coating on Li—Ni—Co—Mn-0 Particles as Positive Electrode Material for Lithium-Ion Batteries," Chem. Mater. 17: 3695-3704 (2005).

Ohta et al. "Enhancement of the high-rate capability of solid-state lithium batteries by nanoscale interfacial modification", Advanced Materials, 2006, vol. 18, pp. 2226-2229.

Petrova et al., "Reaction of TiCl4 and H2O vapor products with a mica surface", Lensovet Leningrad Technology Institute. Translated from Zhurnal Prikladnoi Khimii, Jun. 1986, vol. 59, No. 6, pp. 1224-1227.

Snyder, Mark Q., et al, "Preparation and Characterization of ALDN TiN Thin Films on Lithium Titanate Spinel(Li4Ti5O12)for Lithium-Ion Battery Applications." Paper presented at Fall MRS Meeting, Boston, MA (Nov. 29, 2006, 9:45 AM).

Snyder, Mark Q., et al., "Preparation and Characterization of ALDN TiN Thin Films," Mater. Res. Soc. Symp. Proc., vol. 972 (2007), Materials Research Society 0972-AA07-05-BB08-05(based on the public presentation of reference R2A), in Solid-State Ionics, pp. 331-338 (2006),Issue 2007.(http://www.mrs.or/fall 2006).

Volkova et al., "Interaction of chromyl chloride with silica gel", Lensovet Leningrad Technological Institute. Translated from Zhurnal Obshchei Khimii, Jul. 1972, vol. 42, No. 7, pp. 1431-1434.

Wank, Jeffrey R., et al., "Coating fine iron particles with an oxidation-resistant ◆ 3B3-alumina nanolayer using ALD in a fluidized bed reactor." Paper presented at the Conference of "Fluidization XI, Present and Future for Fluidization Engineering." Naples, Italy (May 12, 2004, 12:40PM).

(56) References Cited

OTHER PUBLICATIONS

Wank, Jeffrey R., et al., "Coating fine iron particles with an oxidation-resistant-alumina nanolayer using ALD in a fluidized bed reactor." In Fluidization XI Proceedings of the 11th International Conference on Fluidization Engineering, U. Arena, et al., eds. (Brooklyn, NY: Engineering Conferences International), pp. 603-610 (May 1, 2004) (Distributed first day of conference, and earlier to some pre-registrants.).

Wayback Machine (Internet) archive—showing Beetstra, 12th International Conference paper available on internet Jul. 2007.

Y.-K. Sun, et al., "Significant improvement of high voltage cycling behavior AlF3-coated LiCoO2 cathode", Electrochemistry Communications, 8:821-826 (2006).

\* cited by examiner

METHOD FOR COVERING PARTICLES, ESPECIALLY A BATTERY ELECTRODE MATERIAL PARTICLES, AND PARTICLES OBTAINED WITH SUCH METHOD AND A BATTERY COMPRISING SUCH PARTICLE

CROSS-REFERENCE TO RELATED PATENT APPLICATIONS

This application is a Divisional of U.S. application Ser. No. 14/625,442, filed Feb. 18, 2015, now issued as U.S. Pat. No. 9,705,125, which is a Divisional of U.S. application Ser. No. 11/955,184, filed Dec. 12, 2007, now issued as U.S. Pat. No. 8,993,051. The contents of these applications are incorporated herein by reference in their entirety.

BACKGROUND OF THE INVENTION

Field of the Invention (Technical Field)

The present invention relates to a method for covering particles having a diameter of maximally 60 µm by means of atomic layer deposition. The present invention also relates to particles obtainable by such method, and a battery containing said particles.

Description of Related Art

Such a method is known from the art. Although hereinafter mainly reference will be made to particles to be used in a battery, for example and preferably lithium containing particles, such as $LiMn_2O_4$, $LiCoO_2$ or $LiNiO_2$ as well as other lithium containing materials, such as $LiFePO_4$ and others, the method can be used for subjecting all kinds of particles in the said size range by means of atomic layer deposition.

In the art, the use of lithium ion batteries has many advantages over other cathode material containing batteries, especially with respect to rechargeable batteries. Compared to nickel-cadmium batteries and nickel-metal-hydride batteries, the output voltage of lithium ion batteries is higher. Secondly, the energy density is higher, resulting in smaller and lighter batteries. Other advantages of lithium ion batteries are a low self-discharge, good cycle-life and very low maintenance. Drawbacks of lithium ion materials are the relatively high costs and long charging times, and the fact that the batteries age in time, whether they are being used or not.

During the discharge of the lithium ion batteries, lithium ions are transferred from the negative electrode side of the battery to the positive electrode side. Recent research activities have provided new electrode materials, that provide an improved transport of lithium ions. An example of this material is $Li_4Ti_5O_{12}$, which is used as a negative electrode material having the spinel structure. This material has a three-dimensional structure for lithium intercalation (the insertion of lithium into the crystal lattice). With this material, high charge and discharge rates are possible. A drawback of this material is that the potential at which lithium intercalation occurs is much higher than that for negative electrode materials used thus far. As a result, the battery will have a lower output voltage than was usual for lithium ion batteries. To compensate for this problem, new positive electrode materials have been developed with higher potentials than the currently used materials. Potential (Possible) new positive electrode materials are based on $LiMn_2O_4$ (comprising a 50/50 combination of $Mn^{3+}$ and $Mn^{4+}$), with possible additives like Mg, Ni, like $LiMg_xNi_{0.5-x}Mn_{1.5}O_4$, (comprising only $Mn^{4+}$) which is also of the spinel-type. The positive electrode voltage is 4.7-4.9 V, against $Li/Li^+$. Therefore, the battery output voltage for a combination consisting of $Li_4Ti_5O_{12}/LiMg_xNi_{0.5-x}Mn_{1.5}O_4$ (comprising $Mn^{4+}$, and a combination of $Ni^{2+}$ and $Ni^{4+}$) can be 3.2-3.4 V, which still is a very acceptable value.

Hereafter in this description the negative electrode will be referred to (identified) as the anode and the positive electrode will be referred to (identified) as the cathode.

A problem with the above identified cathode material is the dissolution of transition metal ions, especially Mn-ions, in the electrolyte. When this occurs, the structure of the material changes and there is a smaller number of positions available for lithium intercalation. In addition, the high oxidation ability of $Mn^{4+}$-ions may lead to a decomposition of the solvents in the electrolyte. These factors lead to a capacity loss that is independent of the cycling but proceeds progressively in time. The capacity fading increases with temperature: when Li-ion batteries are stored at temperatures of 60° C., a battery may lose up to 40% of its capacity in only three months time. The problem is more severe for high-voltage materials (e.g. Mn and Fe comprising materials) than for "regular" cathode materials. A specific example of a Fe-containing cathode material, is $LiFe_xTi_yMn_{2-x-y}O_4$ wherein $0<y<0.3$.

Recently, also research has been performed dedicated to the use of nano-powders in batteries. These powders have several advantages over the current cathode or anode materials. Firstly, the surface area per weight increases strongly, leading to enhanced charge transfer (faster charging). Secondly, the diffusion lengths for Li-ions are very short, which enhances the power performance by increasing the effective capacity for lithium storage. Thirdly, the nano-powders are much more resistant to stresses due to expansion and shrinking during intercalation and de-intercalation of the lithium ions, which cause crystal fatigue and loss of capacity in regular cathode materials.

An important drawback of nano-materials in batteries is the increased dissolution of the transition metal ions. This dissolution in the electrolyte is a surface related problem, and therefore increases very fast with decreasing particle size.

BRIEF SUMMARY OF THE INVENTION

Therefore, the invention aims at providing a method for protecting the nano-particles from dissolution in the electrolyte.

The invention also aims at providing a method for providing a coating on nano-particles, without influencing the electrochemical properties of the particles.

The invention especially aims at providing a coating on lithium containing particles of less than 60 µm.

DETAILED DESCRIPTION OF THE INVENTION

According to the invention, the method for covering said particles comprises the steps as mentioned in claim 1. By means of this method, a very uniform and as thin as possible layer is obtained on said nano-particles. According to a preferred embodiment, the method further comprises the step of (b) subsequently fluidizing said particles in said fluidized bed reactor using a second reactant gas comprising a second reactant for substantially completely covering said particles obtained in step (a) with a monolayer of said second reactant. Such a method is especially preferred if a layer should be provided on the nano-particles that is a product of two different reactants, that are provided subsequently to the nano-particles. Such is especially very suitable if the first reactant adsorbs on and/or optionally reacts with the nano-particles, and wherein the second reactant adsorbs on and/or reacts with the first layer that is provided on the nano-particles. A preferred embodiment comprises the step adding as said first reactant a component chosen from any of: a hydroxide providing component, an oxide providing reactant, an alkyl metal providing component, a metal alkanolate providing component, or the like, and adding as said second reactant a reactant that is different from said first reactant and is chosen from any of: a hydroxide providing component, an oxide providing reactant, an alkyl metal providing component, a metal alkanolate providing component, or the like. As a matter of fact, if the nano-particles already comprise an oxide layer or a hydroxide layer, the first step of the method according to the invention may comprise adding a reactant that provides a metal on said nano-particles, preferably an alkyl metal compound or a metal alkanolate compound, such that a monolayer of the reaction product of this metal with the hydroxide or oxide may be obtained. If required, a further suitable reactant may subsequently be added, so as to obtain a dry alumina monolayer on said material (or any respective metal oxide layer, for example a zincoxide monolayer).

Any combination of reactants may be added subsequently during fluidization of the nano-particles, so as to add a first reactant that adsorbs to and/or reacts with the surface layer of the nano-particles, wherein the second reactant adsorbs to and/or reacts with the firstly added reactant, and one or more further reactants are added in subsequent steps for further adsorption to and/or reaction with said secondly added reactant.

All steps wherein different reactants are added, are performed subsequently. The addition of the first reactant in a carrier gas or as a pure reactant, may be followed by the addition of a second reactant, optionally in a carrier gas or as a pure reactant, and may be performed without interruption, and optionally with the intermittent addition of a gas that is non-reactive (i.e., inert) to the nano-particles and/or the reactant added previously.

A suitable method may consist of adding a fluidization gas to the particles in a fluidized bed and injecting, or otherwise adding, said reactant to the fluidization gas. This is a convenient way to keep the fluidization gas substantially constant and wherein the amount of reactant can be adjusted precisely.

It is preferred that the method is performed on particles having a diameter of maximally 60 µm. Preferably, the particles have a diameter in the range within 10 nm and 500 nm. More preferably, the diameter of the particles is at least 10 nm at maximally 100 nm.

It has shown that a battery containing electrode particles that are protected by means of a nano-layer that is obtained by a method according to the present invention, has an increased lifetime. Although a fluidization technique has already been used for atomic layer deposition on small particles, this method has hitherto not been used for nano-particles. Fluidization techniques for such particles are only known for systems where the pressure in the fluidization reactor is reduced. According to the present invention, it has shown that it is possible to use increased pressures in the fluidization reactor, of about atmospheric pressure or above. As a rule, this pressure is measured at a position above the fluidized bed.

It was regarded impossible to perform an atomic layer deposition technique on nano-particles since, due to the very high contact surface the heat production would become too high. However, with the present invention this has shown to be no problem at all. On the contrary, the temperature in the fluidized bed is very homogeneous, probably due to the intense mixing of the particles in the fluidized bed. As a consequence, the covering of the nano-particles with the reactant (reactants) is very homogeneous, such that nano-particles are obtained with a very homogeneous nano-layer thereon, and as a result of which, the batteries have a very constant quality.

The method according to the state of the art for covering nano-particles consisted of using a chemical vapor deposition technique on nano-particles, however, without intense stirring of the nano-particles. As a consequence, the layer covering the nano-particles was very inhomogeneous and hence, the quality of the batteries obtained therewith also fluctuated greatly.

According to the state of the art, the dimensions of the nano-particles were increased, with a consequence that diffusion length of the lithium ions increases, and the charging and discharging time also increased.

The invention will now be further elucidated by means of an example. This example is only intended to provide an explanation of the invention, and should not be regarded as a limitation to the scope of protection.

In the fluidized bed reactor, a vibrator is used. Due to this vibrator, an increased fluidization of the nano-particles is obtained. However, this vibrator is not an obligation.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

These steps are repeated until a sufficient number of cycles have been performed to achieve the desired thickness of the coating.

The variables that can be adapted in the ALD-process are the number of cycles, coating material, overall flow, reactant concentration, cycle times for precursor and water, vibration frequency, reaction temperature, etc. During the process the temperature, pressure difference and pressure fluctuations are recorded.

For the experiments described in this paper, only the fluidization part of the set-up has been used, i.e., gas without reactants for the fluidization, assisted by vibration. The gas flow was varied from 0 to 2 l/min. (velocities of 0-63 mm/s), and several vibration frequencies were used, ranging from 0-47 Hz. Higher gas velocities were not used because the particles started to be elutriated from the column.

Pressure fluctuations were measured at a frequency 20 of 400 Hz using piezo-electric pressure transducers, Kistler type 7261, at two heights in the column: 50 mm and 125 mm above the gas distributor. For titania particles, that were used in some experiments, the data from 125 mm are given here because of a blockage of the lower measuring point after some time; for the cathode particles the height of 50 mm was used due to the lower initial bed height. For the titania particles, the data from the higher and lower measuring point were comparable. The fluidization experiments were done at room temperature and atmospheric pressure.

Figure 1:
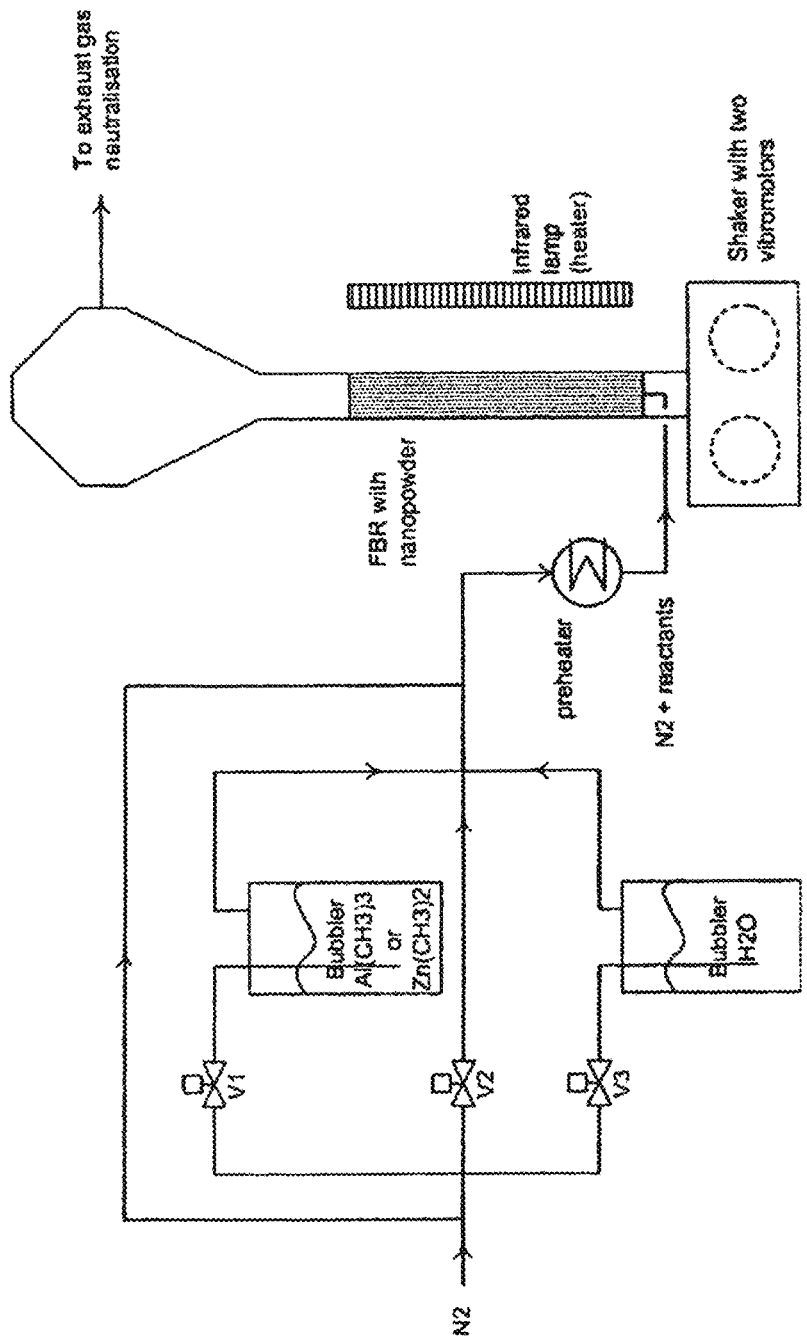
FIG. 1 shows a schematic drawing of the experimental setup for the ALD-process (atomic layer deposition). It consists of a 26 mm internal diameter, 500 mm long glass reactor tube that is filled with $LiMg_{0.05}Ni_{0.45}Mn_{1.5}O_4$ nano-particles with a diameter of 10-50 nm. The reactor is placed on a shaker driven by two vibromotors that produce a low amplitude vibration at adjustable frequency to assist fluidization. The fluidizing gas is nitrogen. Each ALD-cycle consists of four process steps:
1. Valve V1 is opened, so that part of the nitrogen is led through a bubbler containing the organo-metallic precursor and saturated with its vapor. This vapor adsorbs on the particle surface;
2. When the complete particle surface is covered with the precursor, V1 is closed and V2 is opened to flush the tubes with pure nitrogen. This prevents (undesired) reactions in the tubes;
3. V2 is closed and V3 opened to lead the gas through a bubbler containing water. The water vapor reacts with the organo-metal on the surface of the powder;
4. V2 is opened again and V3 closed to clear the tubes for the next cycle.
Figure 2:
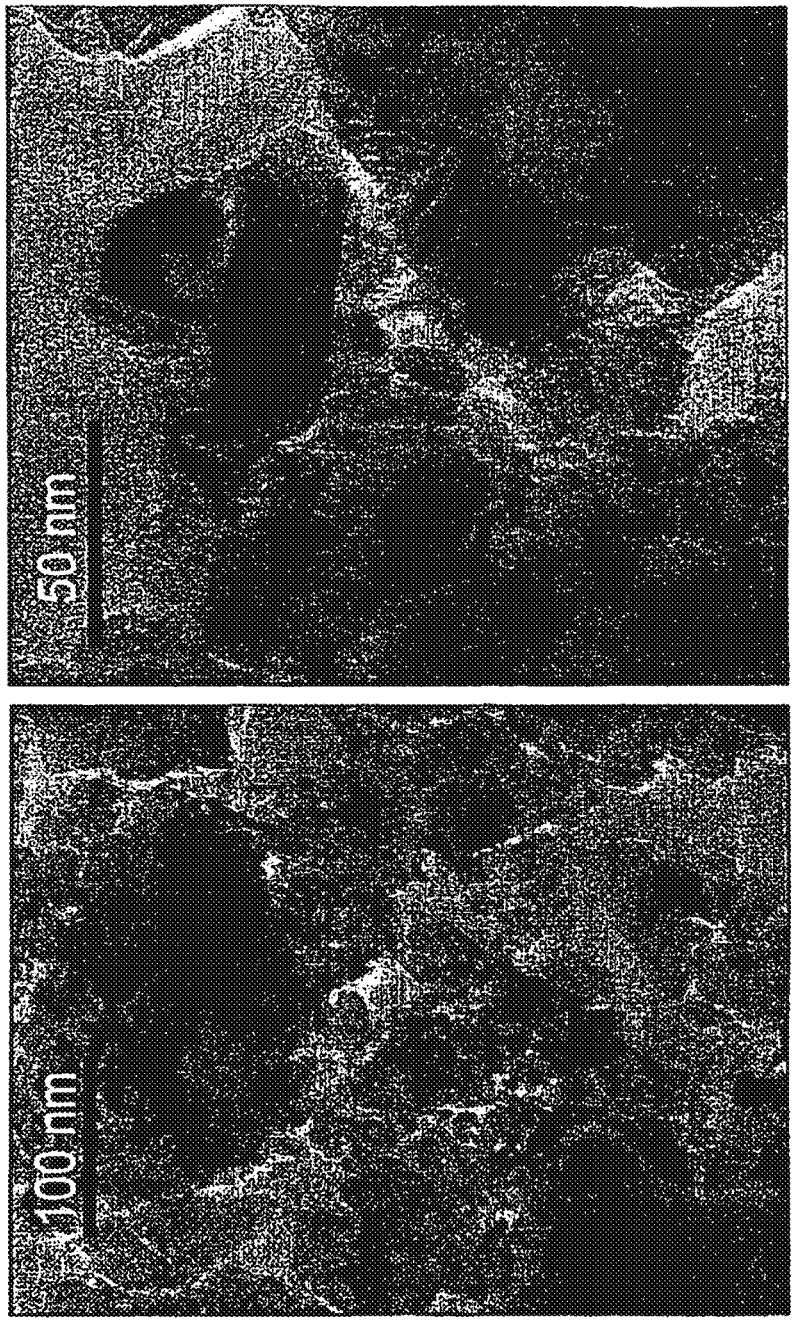

Two types of particles were used: the first type is the $LiMg_{0.05}Ni_{0.45}Mn_{1.5}O_4$ cathode material, which was prepared by an auto-ignition method (described by Lafont et al.). FIG. 2 shows TEM (transmission electron microscope) pictures of this material. The particle dimensions observed in these TEM images are 20-100 nm. A (Brunauer-Emmett-Teller) BET-analysis rendered a surface of 6.4 $m^2/g$, from which an equivalent diameter of 213 nm can be calculated. Laser diffraction showed a very wide particle size distribution, ranging from 40 nm or smaller (40 nm is the lower limit of the apparatus) to 60 μm (clusters). Combination of these measurements leads to the conclusion that the particles form clusters, and that part of the clusters are "hard" aggregates, with some necking between the primary particles. To make a comparison possible, also a more common type of nanoparticles has been investigated: commercial titania particles. These particles have a diameter of 20-25 nm and a surface area of 90 $m^2/g$ (data from manufacturer Kerr-McGee Pigments). It is expected that it is a loose powder and at all aggregates in this powder are soft aggregates that break up easily.

Figure 3:
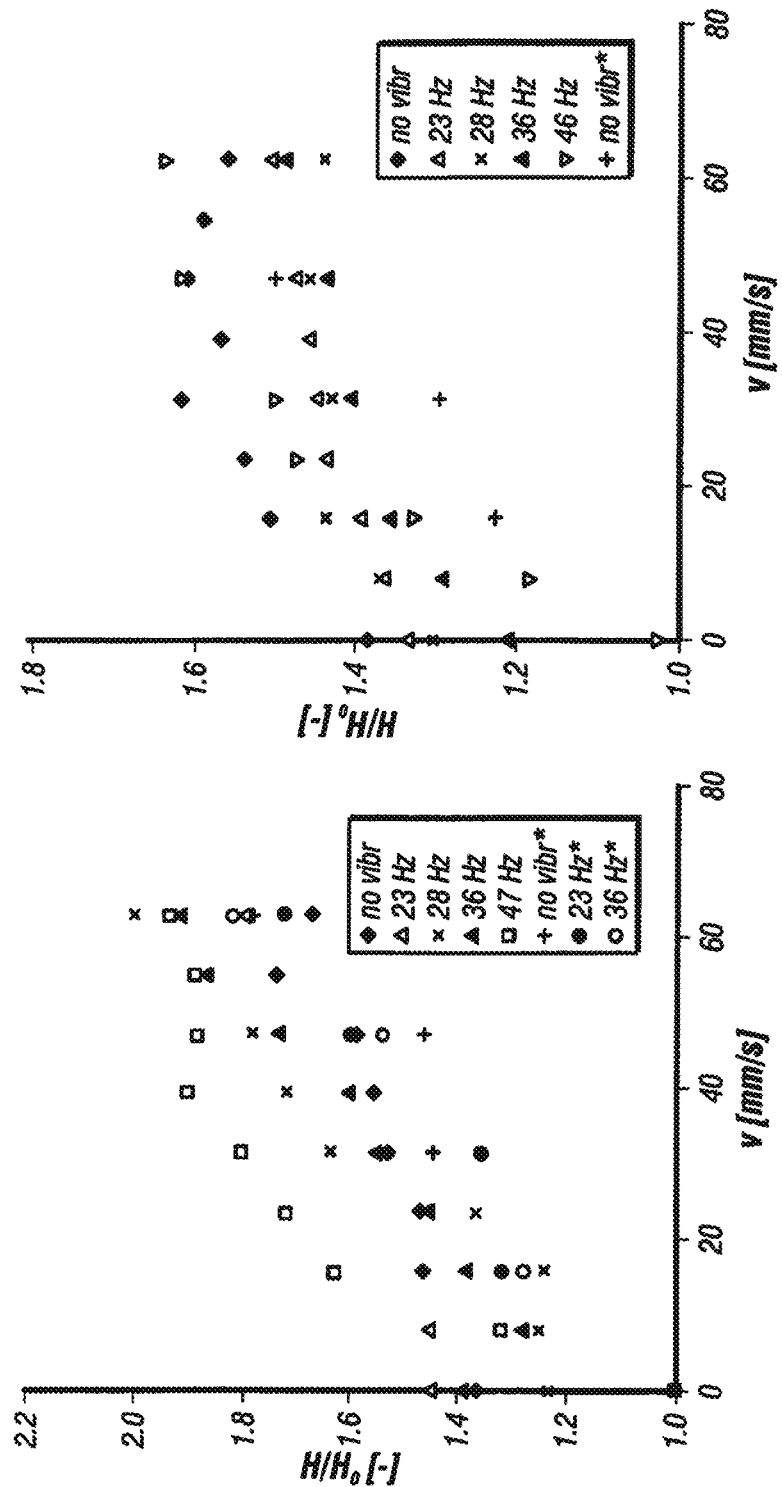

FIG. 3 shows the relative bed expansion during the experiments. To calculate this, the minimum bed height as measured during all experiments, was taken as the initial bed height $H_0$. This minimum was found when the bed was compacted at the highest vibration frequency. For these experiments, the vibration frequency was set to a fixed value, and the gas velocity adjusted. We started with the lowest frequency.

However, the experiments were also carried out with particles with a history of vibration, also at high frequencies; these particles are marked with an * in the figures. The graphs confirm that the initial bed height depends on the vibration frequency, at higher frequencies the particles are packed closer.

Visual observations of the fluidization behavior of the cathode particles suggest that at low gas velocities, there is some channeling. At higher velocities, the eruptions at the bed surface are more violent and appear to originate from (small) bubbles, although these are hard to distinguish since the powder is black. The vibrations have some influence: at high frequencies bubbles start to appear at lower gas velocities. The effect was not quantified due to aforementioned visibility problems. For the (white) titania powder it is easier to distinguish channels and bubbles. For each velocity and frequency, there is a certain part in the bottom of the bed that is not moving. Some large aggregates can be distinguished here and channeling occurs in between these aggregates. The height of this part decreases with gas velocity and vibration frequency. Above this bottom zone, the bed fluidizes with small bubbles. A memory effect could be noticed for both particle types, although it was stronger and lasted longer for the titania. The non-moving bottom zone was much smaller for particles with a history of vibration than for "fresh" particles. An explanation could be that part of the aggregates was broken up by the high frequencies, and only the very large (hard) aggregates remained. The bed expansion factor H/H0 reached a maximum value of 2.0 for the cathode particles and 1.63 for the titania particles. It was also found that when the vibration and gas flow are stopped, the bed does not return to its initial height, and even after several days it may still be expanded (H/H01, 4), showing that the aggregates are very loosely packed. The measured porosities for the cathode particles were in the range of 0.66-0.83, and for the titania it was 0.87-0.92.

Figure 4A:
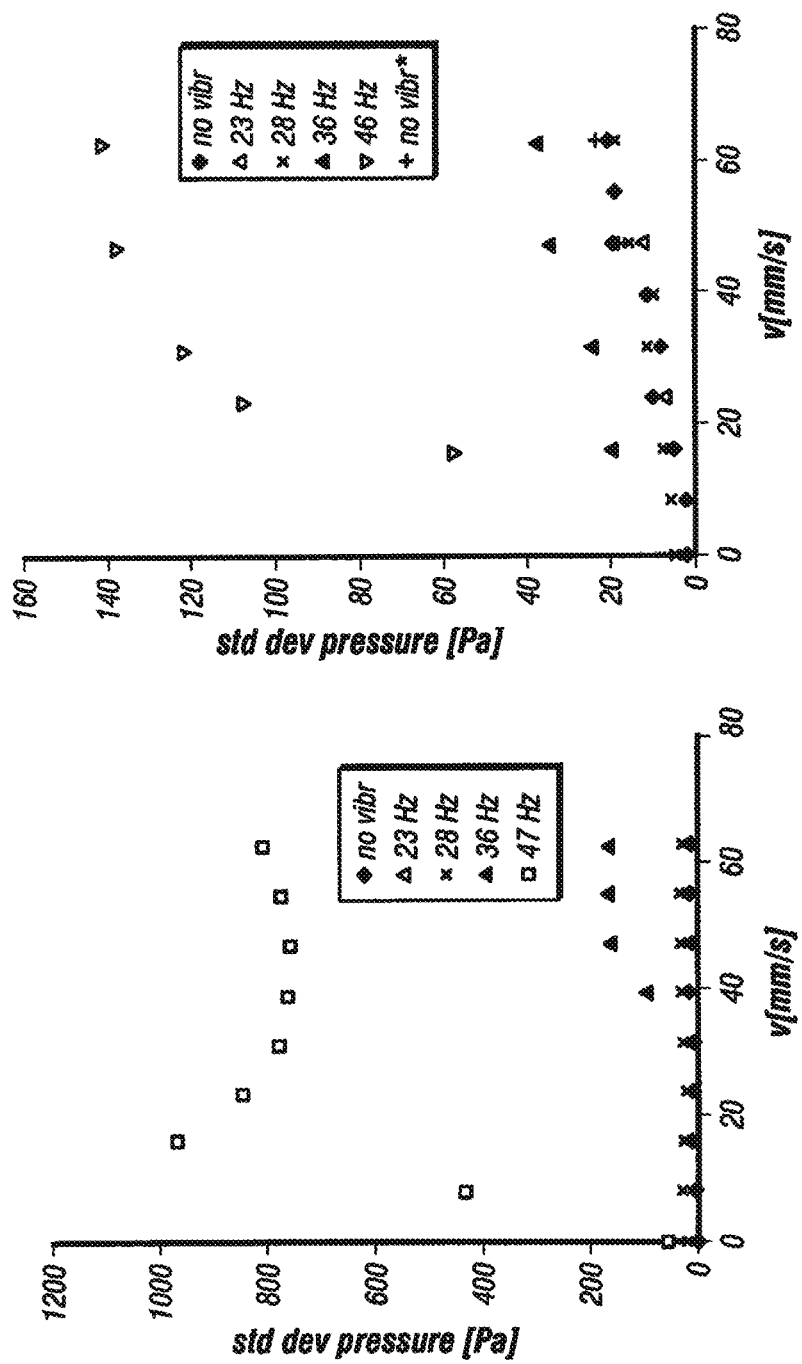
Figure 4B:
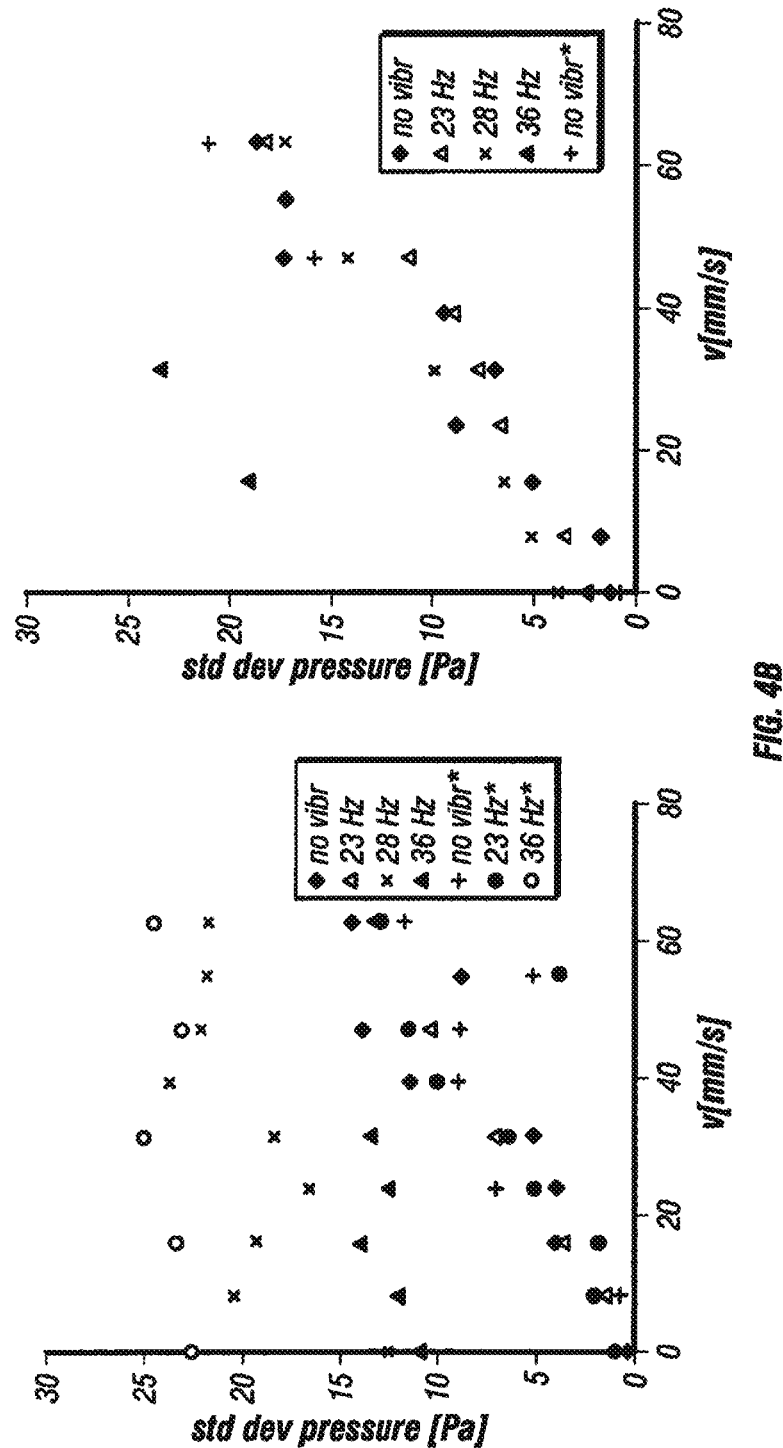

FIGS. 4A and 4B show the standard deviation of the pressure signal during the experiments, which could provide information on the regime in which the fluidized bed is operating. The pressure fluctuations in the experiments with a high vibration frequency are determined mainly by the vibrations, the influence of the gas flow was minor. This was confirmed by the power spectrum, where high peaks occurred at the vibration frequency. When there is no vibration or vibration at a low frequency, there is a noticeable influence of the gas flow on the pressure fluctuations, as is observed in a regular gas-fluidized bed as well.

For the cathode particles, the sudden rise followed by a decrease in the fluctuations at high frequencies could indicate a transition from bubbling to turbulent regime. However, more data are necessary to confirm this and explain the mechanism. For the $TiO_2$ this transition was not observed for the studied range of gas velocities. The data series from particles with a vibration history show that this history and the change in fluidization behavior it causes do not have a large influence on the pressure fluctuations.

Figure 5:
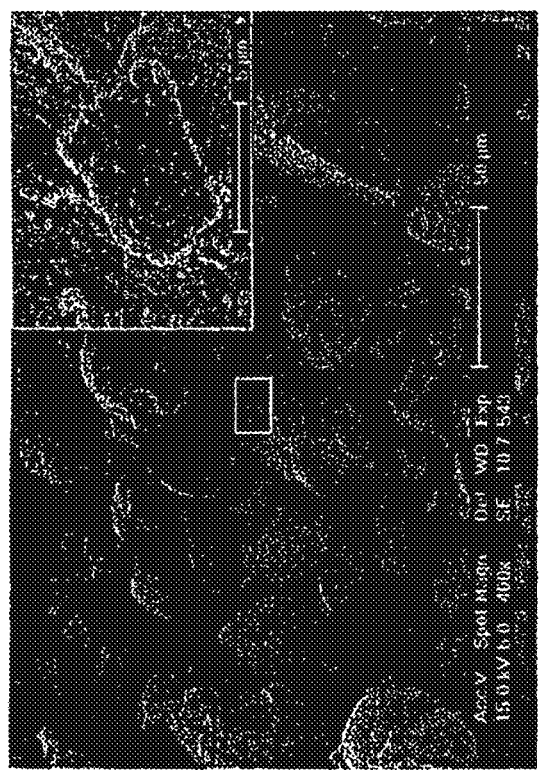
Figure 6:
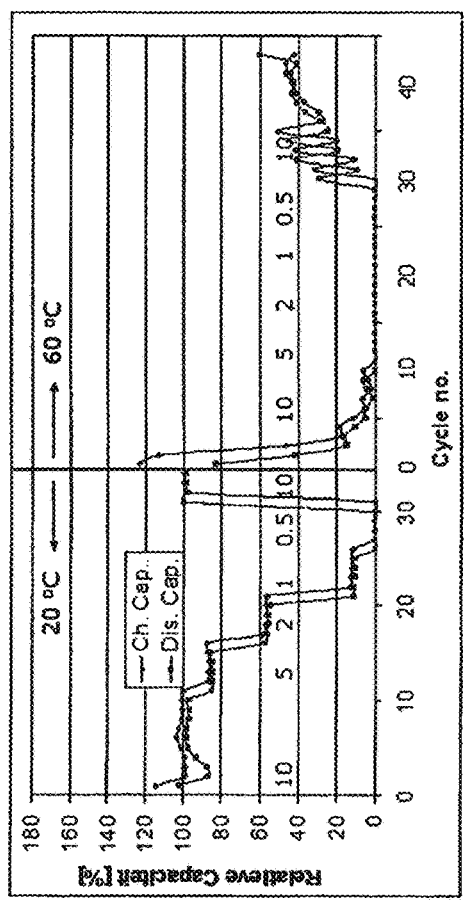

FIG. 5 further shows SEM (scanning electron microscope) photographs of particles obtained according to the method of the present invention and wherein as a first reactant water was added for forming a hydroxide monolayer on the particles ($LiMn_2O_4$). Then, trimethylaluminum (TMA) was added to the fluidization gas so as to perform a reaction of said TMA with the hydroxide monolayer. Subsequently, a further addition of water was performed, and a first monolayer of alumina on said particles was obtained. This combination of steps was repeated until an alumina layer on said particles was obtained in a sufficient thickness and was very homogeneous. The layer turned out to have a thickness of about 2 nm and consisted (by means of EDX (energy dispersive x-ray) in a SEM) of aluminium oxide The FIG. 6 shows the results on cyclic behavior of repeatedly charging and discharging batteries made from the coated particles according to the invention and uncoated particles as a reference example. Both at low temperature (20° C.) and high temperature (60° C.) the capacity at fast and slow discharge and charge rate is much higher in the batteries containing the coated particles as cathode material. Also, the uncoated particles show a clear fading in capacity due to degradation of the cathode material.

Therefore, from the above example, it can be concluded that the method, according to the present invention, is a suitable way for providing a protective layer on nanoparticles.

What is claimed:

1. A powder comprising a plurality of lithium-containing particles of 60 microns or less having and a protective layer, wherein the protective layer comprises a hydroxide layer on the surface of the lithium-containing particles and a first monolayer of a metal oxide adsorbed to and/or reacted with the hydroxide layer on the surface of the lithium-containing particles, and wherein the protective layer is configured to protect the particles from dissolution in an electrolyte when used at a positive electrode voltage of 4.7-4.9 Volts against Li/Li+.

2. The powder of claim 1, which further comprises at least one of Nickel, Manganese, Cobalt, Iron, Titanium, Magnesium or Phosphorous.

3. The powder of claim 1, wherein the particles comprise a lithium metal oxide or a lithium metal phosphate, wherein the metal comprises at least one of Nickel, Manganese, Cobalt, Iron, Titanium or Magnesium.

4. The powder of claim 1, wherein the protective layer is obtained by a vapor reaction or adsorption process, or atomic layer deposition.

5. The powder of claim 1, wherein the lithium-containing particles contain manganese having a valence state of at least one of Mn2+, Mn3+, or Mn4+.

6. The powder of claim 1, wherein the lithium-containing particles contain nickel having a valence state of at least one of Ni2+, Ni3+, or Ni4+.

7. The powder of claim 1, wherein the lithium-containing particles have dimensions of 20-100 nanometers as observed using Transmission Electron Microscope (TEM) images, or a diameter between 10 nanometers and 500 nanometers.

8. The powder of claim 1, wherein the protective layer on the lithium-containing particles further comprises a second monolayer of the metal oxide adsorbed to and/or reacted with the first monolayer of metal oxide.

9. The powder of claim 1, wherein the metal oxide comprises aluminum, and the protective layer comprises aluminum oxide or aluminum hydroxide.

10. An electrode comprising the powder of claim 1.

11. A battery comprising an anode layer, an electrolyte and a cathode layer, wherein the cathode layer comprises the powder of claim 1.

12. The battery of claim 11, wherein the powder comprises a lithium metal oxide or a lithium metal phosphate, and wherein the metal comprises at least one of Nickel, Manganese, Cobalt, Iron, Titanium, and/or Magnesium.

13. The battery of claim 12, wherein the powder comprises at least one of lithium cobalt oxide, lithium nickel oxide, lithium manganese oxide, or lithium nickel manganese oxide.

14. The battery of claim 11, having a battery output voltage of 3.2 to 3.4 Volts and/or a positive electrode voltage of 4.7-4.9 Volts against Li/Li+, and wherein a capacity of the battery at 60° C. is higher than a capacity of a battery having the lithium-containing particles without the protective layer.

15. The battery of claim 11, wherein the lithium metal oxide comprises at least one of manganese having a valence state of at least one of Mn2+, Mn3+, or Mn4+, cobalt having a valence state of Co3+ or nickel having a valence state of at least one of Ni2+, Ni3+, or Ni4+.

16. A battery comprising an anode layer, an electrolyte, and a cathode layer, wherein the cathode layer comprises a protective layer and a plurality of lithium-containing particles of 60 microns or less, wherein the lithium-containing particles are lithium metal oxide or lithium metal phosphate particles, wherein the protective layer comprises a hydroxide layer on the surface of the lithium-containing particles and a first monolayer of a metal oxide adsorbed to and/or reacted with the hydroxide layer on the surface of the lithium-containing particles, wherein the metal comprises at least one of Nickel, Manganese, Cobalt, Iron, Titanium, or Magnesium, wherein the protective layer is produced using atomic layer deposition, the protective layer is configured to protect the cathode particles from dissolution in the electrolyte, and the anode layer comprises lithium titanium oxide particles.

17. A powder comprising a plurality of lithium-containing particles of 60 microns or less and a protective layer substantially covering the lithium-containing particles, the protective layer comprising an atomic layer of metal atoms adsorbed to and/or reacted with the particle surfaces, and an atomic layer of oxygen atoms adsorbed to and/or reacted with the metal atoms, wherein the atomic layer of metal atoms is obtained by the complete coverage of a metal providing reactant on the particle surfaces during a vapor phase reaction or adsorption process.

18. A powder comprising a plurality of lithium-containing particles of 60 microns or less configured for use in a lithium-ion battery, having an alkyl metal compound that is adsorbed to and/or reacted with the surfaces of the plurality of lithium-containing particles.

19. The powder of claim 18, wherein the metal is aluminum.

20. The powder of claim 18, wherein the alkyl metal compound is trimethylaluminum.

21. A powder comprising a plurality of lithium-containing particles of 60 microns or less having a protective layer, wherein the protective layer comprises a hydroxide layer on the surface of the lithium-containing particles and a monolayer of metal oxide adsorbed to and/or reacted with the hydroxide layer, and wherein the protective layer is configured to protect the particles from dissolution in an electrolyte.

* * * * *